United States Patent
Lim et al.

(10) Patent No.: US 6,696,860 B2
(45) Date of Patent: Feb. 24, 2004

(54) VARIABLE VOLTAGE DATA BUFFERS

(75) Inventors: Jong-hyoung Lim, Kyungki-do (KR); Kyung-woo Kang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/157,207

(22) Filed: May 29, 2002

(65) Prior Publication Data

US 2002/0180483 A1 Dec. 5, 2002

(30) Foreign Application Priority Data

Jun. 2, 2001 (KR) ........................................ 2001-31020

(51) Int. Cl.[7] .................. H03K 19/0175; H03K 19/003; H03K 5/12
(52) U.S. Cl. ............................ 326/83; 326/29; 327/170
(58) Field of Search ........................ 326/83, 86, 26–27, 326/29; 327/108, 170, 172, 175

(56) References Cited

U.S. PATENT DOCUMENTS

| 4,959,562 A | * | 9/1990 | Ootani .......................... 326/24 |
| 5,841,305 A | * | 11/1998 | Wilson ........................ 327/175 |
| 6,157,204 A | * | 12/2000 | Sher et al. ..................... 326/21 |

FOREIGN PATENT DOCUMENTS

| EP | 535873 A1 | * 4/1993 | ......... H03K/19/003 |
| KR | 1999-0006314 | 1/1999 | |
| KR | 2000-0003736 | 1/2000 | |

OTHER PUBLICATIONS

Interface Techniques—High Speed CMOS Design Styles, Chapter 6, pp. 207–246, No Date.
Notice to Submit Response, Korean Application No. 10–2001–0031020, Feb. 27, 2003.

* cited by examiner

Primary Examiner—James H. Cho
(74) Attorney, Agent, or Firm—Myers Bigel Sibley & Sajovec

(57) ABSTRACT

A data buffer circuit includes first and second driver circuits coupled to the data latch circuit and operative to respectively pull up and pull down their outputs towards respective first and second voltages responsive to first and second data signals. An output circuit includes first and second transistors connected at an output node and operative to respectively pull up and pull down the output node toward respective ones of the first and second voltages responsive to respective ones of the outputs of the first and second driver circuits. A transition compensation circuit is operative to control relative rates at the output node of the output circuit transitions toward the first and second voltages responsive to a transition rate control signal.

39 Claims, 6 Drawing Sheets

IN THE PRIOR ART, IN A CASE WHERE
VDDP=2.5V AND VDDQ=2.5V

IN THE PRIOR ART, IN A CASE WHERE
VDDP=2.5V AND VDDQ=1.8V

US 6,696,860 B2

1

VARIABLE VOLTAGE DATA BUFFERS

RELATED APPLICATION

This application claims the benefit of Korean Patent Application No. 2001-31020, filed on Jun. 2, 2001, the contents of which are herein incorporated by reference in their entirety.

BACKGROUND OF THE INVENTION

FIG. 1 is a circuit diagram of a conventional data output buffer for an integrated circuit device. Referring to FIG. 1, the data output buffer includes a data transmission circuit 10, a pre-driver circuit 11, and an output driver circuit 17. The data transmission circuit 10 includes transmission gates T1 and T2, latch circuits 3 and 5, and inverters 1 and 7.

The transmission gate T1 outputs data DATA to the pre-driver circuit 11 in response to assertion (for example, to a logic "high") of a transmission control signal BUF, and the transmission gate T2 outputs inverted data $\overline{\text{DATA}}$ to the inverter 7 in response to assertion of the transmission control signal BUF.

The latch circuit 3, which includes inverters I1 and I2 connected in series, and the latch circuit 5, which includes inverters I3 and I4 connected in series, latch output signals of the transmission gates T1 and T2.

The pre-driver circuit 11 includes inverters 13 and 15, and the inverter 13 outputs a signal that swings between a first voltage (i.e., a first supply voltage) VDDP and a second voltage VSSP (i.e., a ground voltage) in response to the output signal of the transmission gate T1, and the inverter 15 outputs a signal that swings between the first voltage VDDP and the second voltage VSSP in response to an output signal of the inverter 7. In general, the first voltage VDDP is 3.3V or 2.5V, and the second voltage VSSP is a ground voltage.

The output driver circuit 17 includes a pull-up circuit MP1 and a pull-down circuit MN1. The pull-up circuit MP1 is implemented by a PMOS transistor MP1 and pulls up an output terminal OUT to a third voltage VDDQ (e.g., a second supply voltage) in response to an output signal UP of the inverter 13. The pull-down circuit MN1 is implemented by an NMOS transistor MN1 and pulls down the output terminal OUT to a fourth voltage VSSQ (e.g., a ground voltage) in response to an output signal DOWN of the inverter 15. Thus, the output terminal OUT swings between the third voltage VDDQ and the fourth voltage VSSQ.

In general, in order to reduce skew during transition to logic "high" or logic "low" of the signal at the output terminal OUT, "turn-on" resistance (hereinafter, referred to as "Ron_mp1") of the PMOS transistor MP1 and "turn-on" resistance (hereinafter, referred to as "Ron_mn1") of the NMOS transistor MN1 can be equalized by controlling the ratio of the channel length and the channel width of the PMOS transistor MP1 and the NMOS transistor MN1.

However, in a case where the third voltage VDDQ is lower than the first voltage VDDP, for example, in a case where the first voltage VDDP is 2.5V and the third voltage VDDQ is 1.8V, the "turn-on" voltage between the gate and the source of the PMOS transistor MP1 may be reduced, e.g., to 1.8V such that the "turn-on" resistance (Ron_mp1) of the PMOS transistor MP1 is undesirably high. However, the signal DOWN input to a gate of the NMOS transistor MN1 swings between the first voltage VDDP and the second voltage VSSP, and thus, the "turn-on" voltage between the gate and the source of the NMOS transistor MN1 is rela-

2 tively high, even though the third voltage VDDQ is lower than the first voltage VDDP. As a result, a transition slope from logic "low" to logic "high" and a transition slope from logic "high" to logic "low" of the signal of the output terminal OUT become different, and thus, skew may occur in the signal at the output terminal OUT.

FIG. 2A illustrates output waveforms at the output terminal OUT in a case where the first voltage VDDP is the same as the third voltage VDDQ. In this case, "turn-on" resistance (Ron_mn1) of the NMOS transistor MN1 and "turn-on" resistance (Ron_mp1) of the PMOS transistor MP1 are the same. Thus, skew does not occur between the transition of the signal of the output terminal OUT from logic "low (0V)" to logic "high" OUT "H" and the transition from logic "high (2.5V)" to logic "low" OUT "L".

FIG. 2B illustrates output waveforms at the output terminal OUT in a case where the first voltage VDDP is different from the third voltage VDDQ. In this case, the "turn-on" resistance (Ron_mn1) of the NMOS transistor MN1 and the "turn-on" resistance (Ron_mp1) of the PMOS transistor MP1 are different. Thus, skew occurs between transition from logic "0V" to logic "OUT "H"" and transition from logic "1.8" to logic "OUT "L"".

SUMMARY OF THE INVENTION

According to some embodiments of the present invention, a data buffer circuit comprises first and second driver circuits operative to respectively pull up and pull down their outputs towards respective first and second voltages responsive to the first and second data signals. The data buffer circuit also comprises an output circuit comprising first and second transistors connected at an output node and operative to respectively pull up and pull down the output node toward respective ones of third and fourth voltages responsive to respective ones of the outputs of the first and second driver circuits. The data buffer circuit further comprises a transition compensation circuit operative to control relative rates at the output node of the output circuit transitions toward the first and second voltages responsive to a transition rate control signal.

In some embodiments of the present invention, the transition compensation circuit comprises a driver circuit, e.g., an inverter, coupled in series with an input of one of the first and second driver circuits, and a bias control circuit coupled to a power supply input of the driver circuit and operative to vary an impedance between the power supply input and a power supply node responsive to the transition rate control signal. In further embodiments, the transition compensation circuit comprises a selective impedance reduction circuit operative to selectively provide an impedance in parallel with at least one of the first and second transistors of the output circuit responsive to the control signal. The data buffer circuit may also include a transition rate control signal generating circuit operative to generate the transition rate control signal responsive to, for example, a state of a fuse or comparison of one of the first and second voltages to a reference voltage.

DETAILED DESCRIPTION

Figure 1:
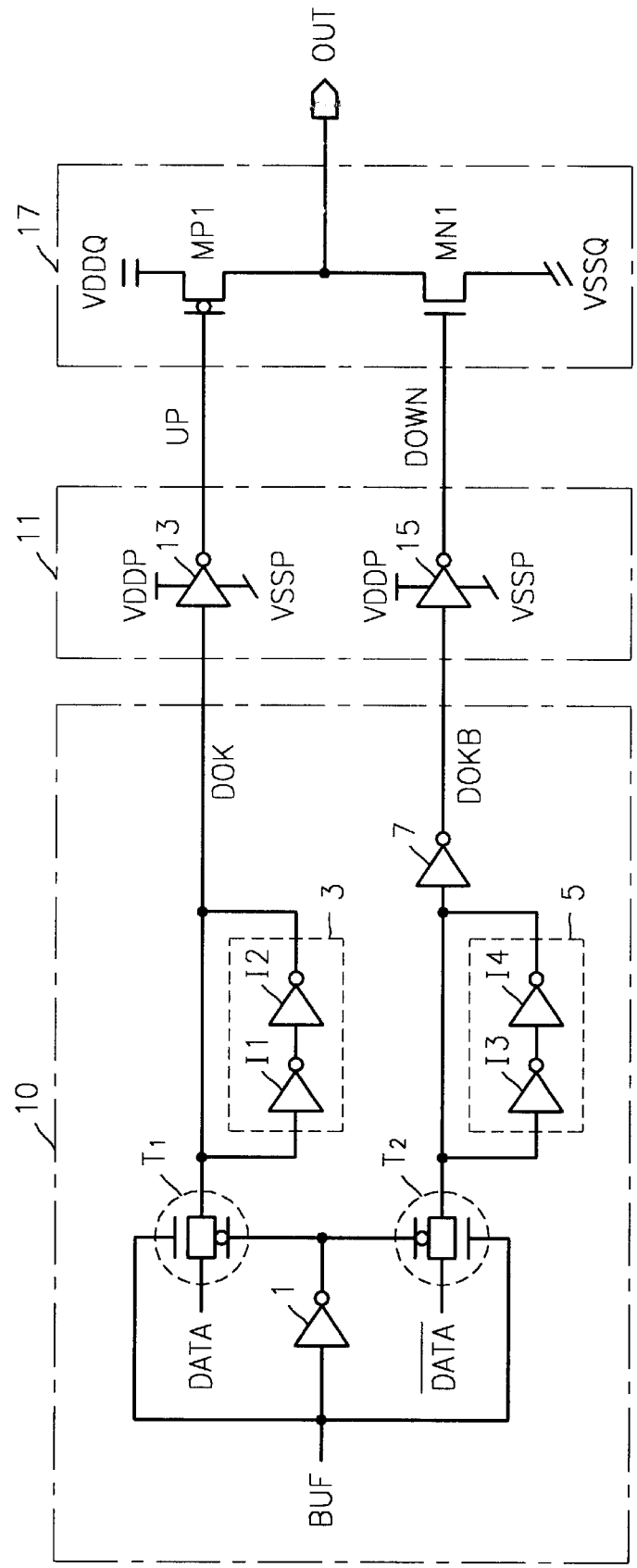
FIG. 1 is a circuit diagram of a conventional data output buffer.
Figure 2A:
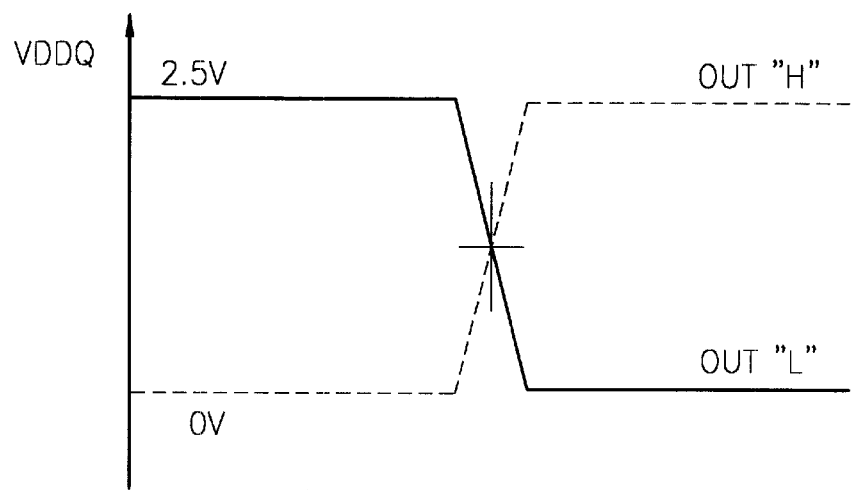
FIG. 2A illustrates an output waveform of an output terminal of the convention data output buffer of FIG. 1 in a case where first voltage VDDP of FIG. 1 is the same as the third voltage VDDQ of FIG. 1.
Figure 2B:
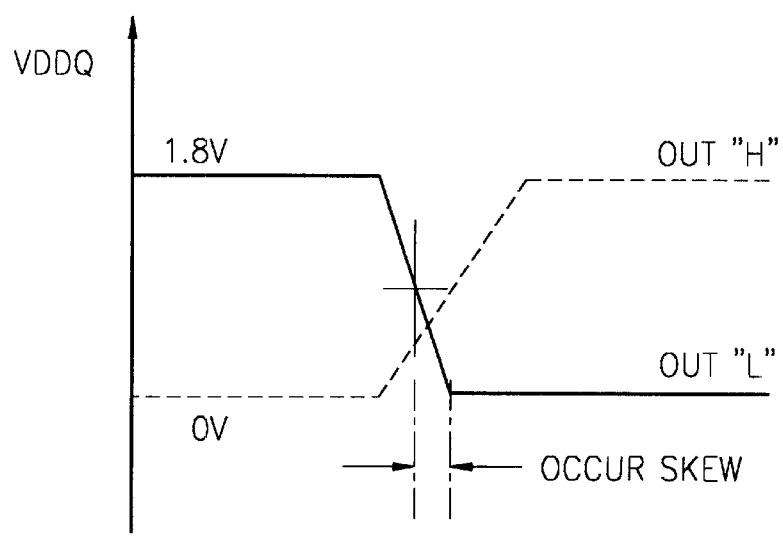
FIG. 2B illustrates an output waveform of an output terminal of the data output buffer of FIG. 1 in a case where the first voltage VDDP of FIG. 1 is different from the third voltage VDDQ of FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 3:
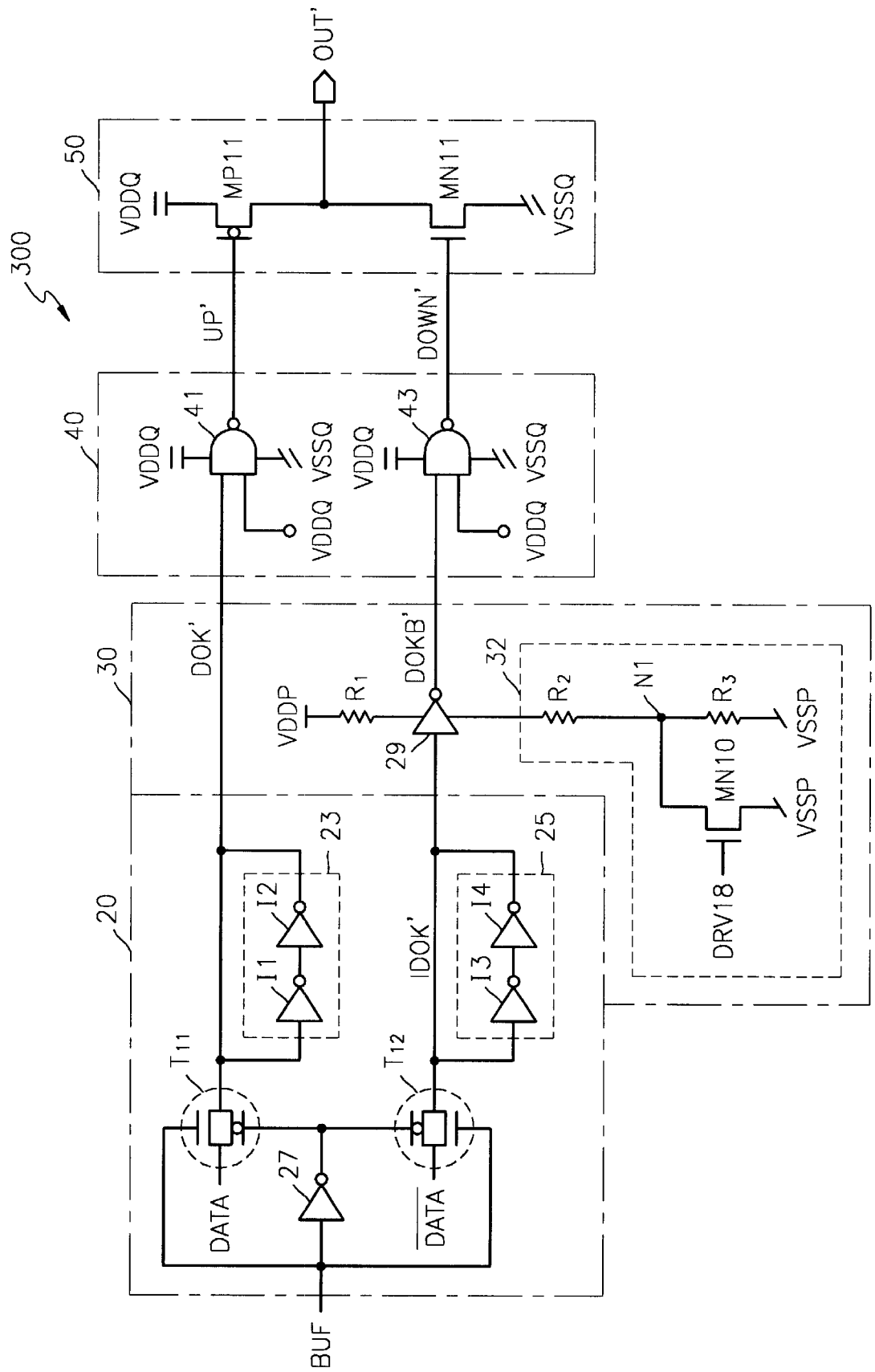
FIG. 3 is a circuit diagram of a data output buffer according to some embodiments of the present invention.

FIG. 3 is a circuit diagram of a data output buffer 300 according to an embodiment of the present invention. Referring to FIG. 3, the data output buffer 300 includes a data transmission circuit 20, a transition compensating circuit 30, a pre-driver circuit 40, and an output driver circuit 50. The data transmission circuit 20 includes transmission gates T11 and T12, latch circuits 23 and 25. The transmission gate T11 outputs data DATA to the pre-driver circuit 40 in response to assertion (for example, to logic "high") of a transmission control signal BUF, and the transmission gate T12 outputs inverted data $\overline{DATA}$ to the inverter 29 in response to assertion of the transmission control signal BUF. The latch circuit 23, which includes inverters I1 and I2 connected in series, and the latch circuit 25, which includes inverters I3 and I4 connected in series, latch output signals DOK' and IDOK' of the transmission gates T11 and T12.

The transition compensating circuit 30 includes an inverter 29 that produces an output signal DOKB' that swings between a first power supply voltage VDDP and a second power supply voltage VSSP in response to the output signal of the transmission gate T12, i.e., the output signal DOKB' is pulled-up to the first power supply voltage VDDP or pulled-down to the second power supply voltage VSSP. A resistor R1 is connected between a first supply voltage terminal of the inverter 29 and the first power supply voltage VDDP.

The transition compensating circuit 30 further includes a bias control circuit 32 including a resistor R2 connected between a second power supply voltage terminal of the inverter 29 and a node N1, and parallel combination of an NMOS transistor MN10 and a resistor R3. A control signal DRV18 is input to a gate of the NMOS transistor MN10, and the drain and source of the NMOS transistor MN10 are connected to the other end of the resistor R2 and the second power supply voltage VSSP, respectively. The resistor R3 is connected between the node N1 and the second power supply voltage VSSP. The control signal DRV18 may be generated, for example, by sensing a third power supply voltage VDDQ that is provided to the output circuit 50, as described below with reference to FIG. 5, or by sensing a state of a fuse, as shown in FIG. 6.

The NMOS transistor MN10 has "turn-on" resistance hereinafter referred to as Ron_mn10. When the output signal DOKB' of the inverter 29 is pulled-down to the second voltage VSSP, a transition rate of the output signal DOKB' is determined by a combination of the "turn-on" resistance (Ron_mn10) and the resistor R3. Preferably, the "turn-on" resistance (Ron_mn10) is designed to be smaller than the resistor R3.

For example, in a case where the control signal DRV18 is asserted to a logic "low", the transition rate for the output signal DOKB' of the inverter 29 to be pulled-down to the level of the second voltage VSSP is controlled by:

$$Req1 = R2 + R3 \quad (1)$$

However, in a case where the control signal DRV18 is asserted to a logic "high", a transition rate for the output signal DOKB' of the inverter 29 to be pulled-down to the level of the second voltage VSSP is controlled by:

$$Req2 = R2 + \frac{(R3 \times Ron\_mn10)}{(R3 + Ron\_mn10)} \quad (2)$$

In particular, the transition rate when the control signal DRV18 is asserted is greater than the transition rate when the control signal DRV18 is deasserted.

The pre-driver circuit 40 includes inverters 41 and 43. The inverter 41 outputs a first control signal UP' which swings between a third voltage VDDQ and a fourth voltage VSSQ in response to the output signal DOK' of the transmission gate T11. A conventional inverter for inverting the output signal DOK' of the transmission gate T11 may be used as the inverter 41 but a NAND gate may be used as the inverter 41, as shown in FIG. 3. The inverter 43 outputs a second control signal DOWN' which swings between the third voltage VDDQ and the fourth voltage VSSQ in response to the output signal DOKB' of the inverter 29. The inverter 43 may be, for example, a NAND gate, as shown in FIG. 3, or may be a conventional inverter. The output driver circuit 50 includes a PMOS transistor MP11 having source and drain terminals coupled to an output node OUT' and the third power supply voltage VDDQ, respectively, and an NMOS transistor MN11 having source and drain terminals coupled to the output node OUT' and the fourth power supply voltage VSSQ, respectively. The transistors MP11, MN11 have gate terminals coupled to respective ones of the inverters 41, 43. The PMOS transistor MP11 pulls-up the output terminal OUT' towards the third power supply voltage VDDQ in response to the first control signal UP', and the NMOS transistor MN11 pulls-down the output terminal OUT towards the fourth power supply voltage VSSQ in response to the second control signal DOWN'. The ratio of the channel length and the channel width of the PMOS transistor MP11 and the NMOS transistor MN11 of the output driver circuit 50 may be adjusted to adjust skew at the output terminal OUT'. For example, the "turn-on" resistance (hereinafter, referred to as "Ron_mp11") of the PMOS transistor MP11 and the "turn-on" resistance (hereinafter, referred to as "Ron_mn11") of the NMOS transistor MN11 may be equalized.

Figure 4:
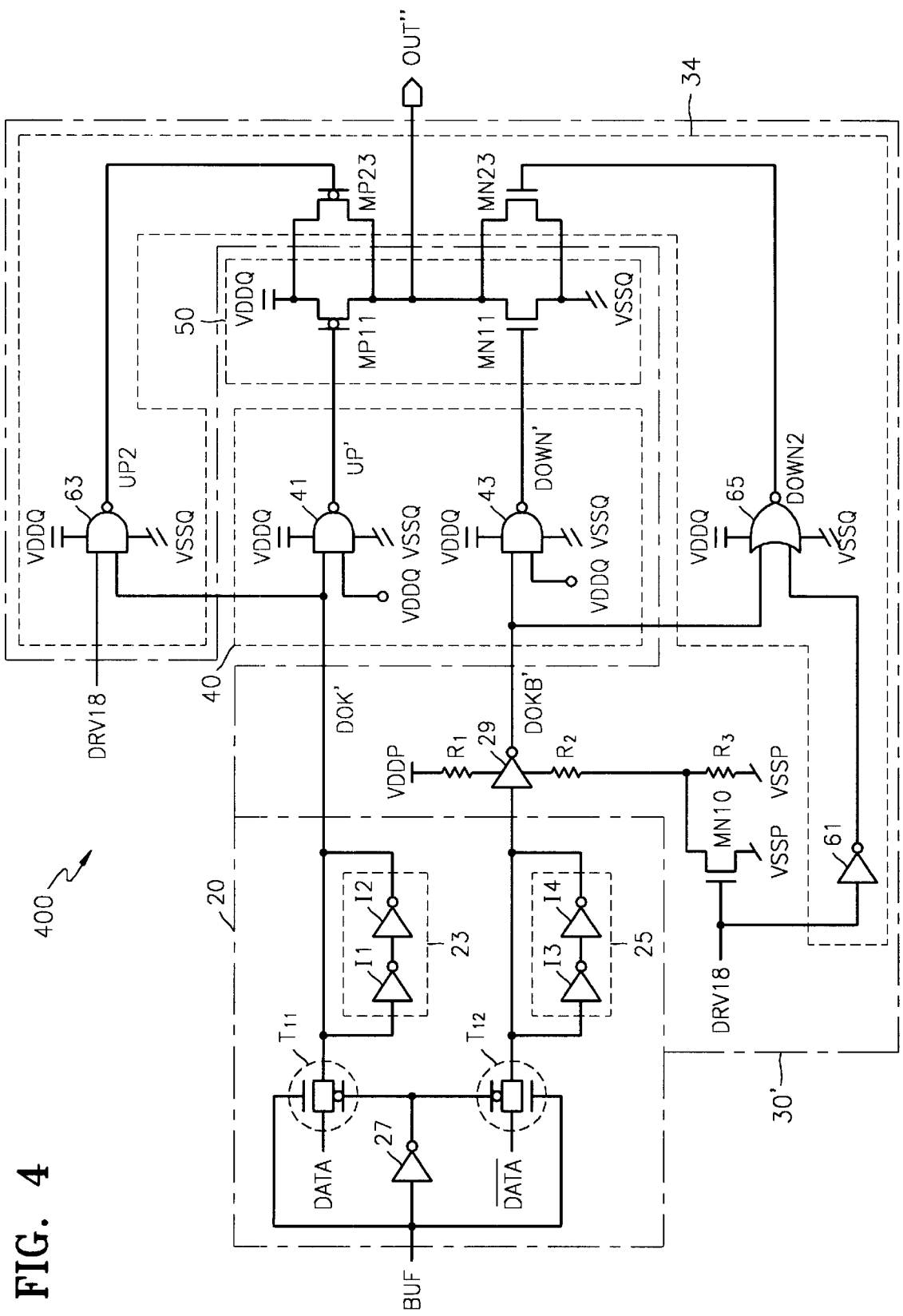
FIG. 4 is a circuit diagram of a data output buffer according to another embodiments of the present invention.

FIG. 4 is a circuit diagram of a data output buffer according to further embodiments of the present invention. Referring to FIG. 4, the data output buffer includes a data transmission circuit 20, a transition compensating circuit 30', a pre-driver circuit 40, and an output driver circuit 50. The data transmission circuit 20, the pre-driver circuit 40, and the output driver circuit 50 of FIG. 4 are the same as the data transmission circuit 20, the pre-driver circuit 40, and the output driver circuit 50 of FIG. 3, and further description thereof will be omitted.

The pre-driver circuit 40 includes inverters 41 and 43. The inverter 41 outputs a first control signal UP' that swings between the third voltage VDDQ and the fourth voltage VSSQ in response to an output signal DOK' of the transmission gate T11. The inverter 43 outputs a second control signal DOWN' which swings between the third voltage VDDQ and the fourth voltage VSSQ in response to an output signal DOKB' of the inverter 29. A PMOS transistor MP11 of the output driver circuit 50 pulls-up the output terminal OUT" to the third voltage VDDQ in response to the first control signal UP', and the NMOS transistor MN11 pulls-down the output terminal OUT" to fourth voltage VSSQ in response to the second control signal DOWN'.

The transition compensating circuit 30' includes an inverter 29, resistors R1, R2, R3, and an NMOS transistor MN10, as in the transition compensating circuit 30 of FIG. 3. The transition compensating circuit 30' further includes a selective output impedance reduction circuit 34, including an inverter 61, a first logic gate 63, a second logic gate 65, an auxiliary pull-up transistor MP23, and an auxiliary pull-down transistor MN23. The inverter 61 inverts the control signal DRV18, and the first logic gate 63 outputs a control signal UP2 in response to the control signal DRV18 and the output signal DOK' of the transmission gate T11. The first logic gate 63 may be realized as a NAND gate. The second logic gate 65 outputs a control signal DOWN2 in response to an output signal of the inverter 61 and the output signal DOKB' of the inverter 29. As shown, the second logic gate 65 may be realized as a NOR gate. The auxiliary pull-up transistor MP23 has a predetermined "turn-on" resistance and pulls-up the output terminal OUT" to the third power supply voltage VDDQ in response to the control signal UP2. The auxiliary pull-down transistor MN23 has a predetermined "turn-on" resistance and pulls down the output terminal OUT" to the fourth power supply voltage VSSQ in response to the control signal DOWN2. The auxiliary pull-up transistor MP23 and the auxiliary pull-down transistor MN23 selectively reduce the "turn-on" resistance (Ron_mp11) of the PMOS transistor MP11 and the "turn-on" resistance (Ron_mn11) of the NMOS transistor MN11, and, thus, can control the transition rate of the signal of the output terminal OUT" responsive to the control signal DRV18.

Figure 5:
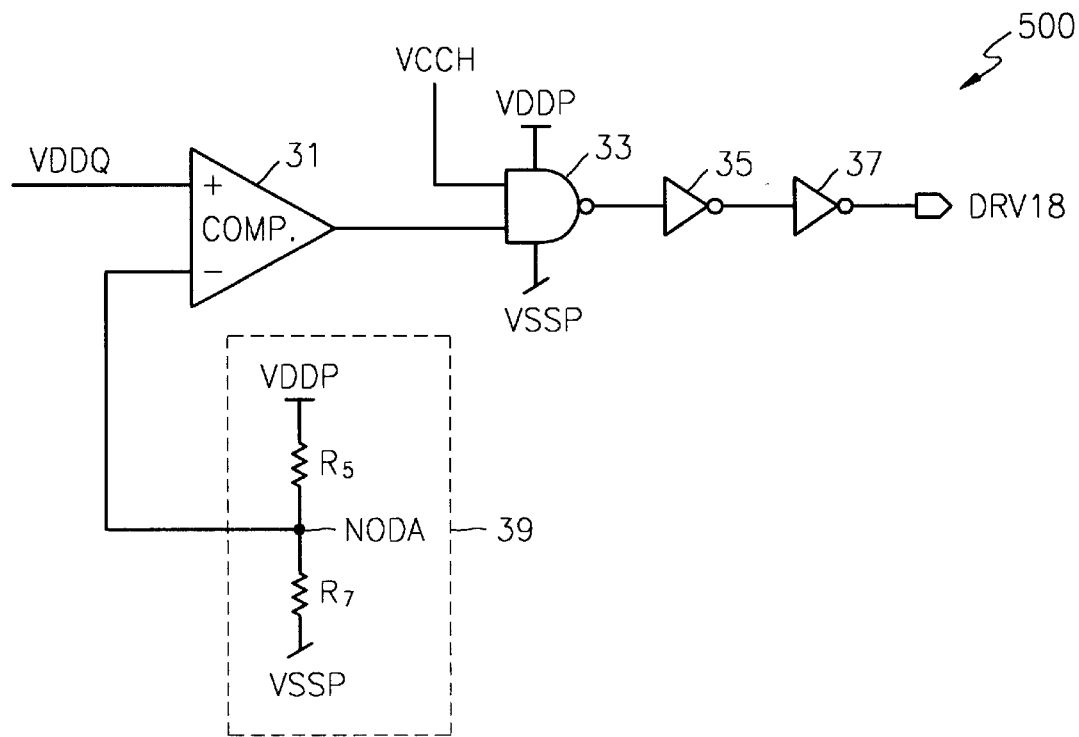
FIG. 5 is a circuit diagram illustrating a voltage sensing circuit according to further embodiments of the present invention.
Figure 6:
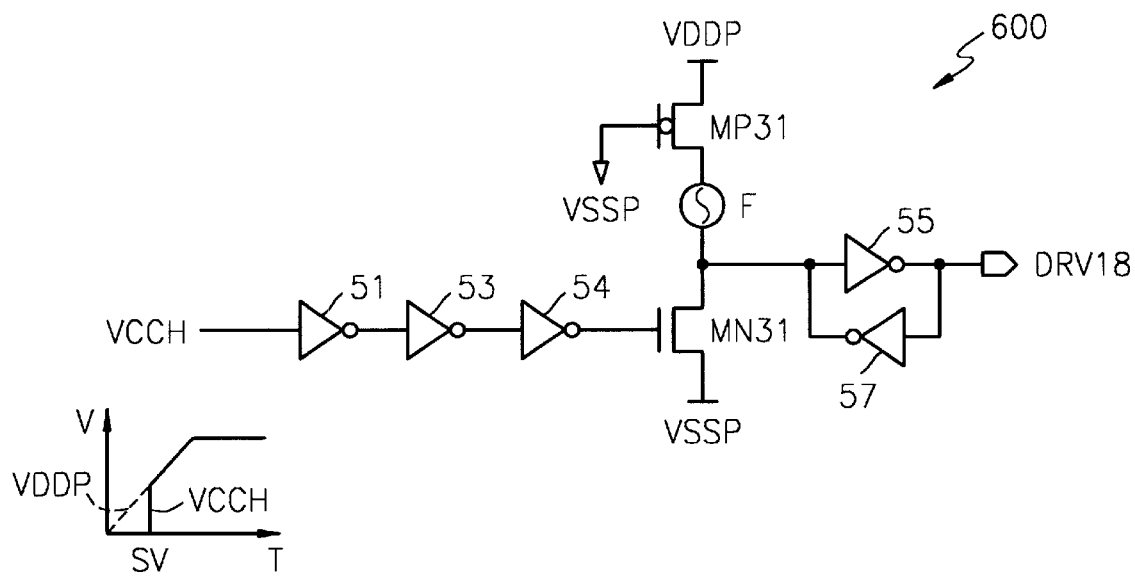
FIG. 6 is a circuit diagram illustrating a voltage sensing circuit according to other embodiments of the present invention.

FIG. 5 is a circuit diagram illustrating an embodiment of a voltage sensing control signal generation circuit 500 according to some embodiments of the present invention that is operative to generate the control signal DRV18 referred to in FIGS. 3 and 4. Referring to FIG. 5, the voltage sensing control signal generating circuit 500 includes a comparing circuit 31, inverters 33, 35, and 37, and a reference voltage generating circuit 39. The reference voltage generating circuit 39 generates a signal at a node NODA using resistors R5 and R7 as a voltage divider. The comparing circuit 31 compares the third voltage VDDQ with the signal of the node NODA and outputs a signal according to the compared result. The inverter 33 outputs a signal that swings between a first voltage VDDP and a second voltage VSSP in response to a power-up signal VCCH and the output signal of the comparing circuit 31. The power-up signal VCCH is first maintained at logic "low" upon power-up and then is equalized with the first voltage VDDP after a predetermined time has elapsed. The inverter 35 inverts the output signal of the inverter 33 and outputs the control signal DRV18. The output signals of the inverters 35 and 37 swing between the first voltage VDDP and the second voltage VSSP.

For example, assuming the voltage of the node NODA is 2.0V and the third voltage VDDQ is 2.5V, the comparing circuit 31 compares the voltage of the node NODA with the third voltage VDDQ and outputs a logic "high." Thus, the control signal DRV18 is deasserted to a logic "low." However, if the third voltage VDDQ is 1.8V, the comparing circuit 31 produces a logic "low," such that the control signal DRV18 is asserted to a logic L "high."

FIG. 6 is a circuit diagram illustrating a control signal generation circuit 600 according to further embodiments of the present invention. The control signal generation circuit 600 includes inverters 51, 53, and 54, a PMOS transistor MP31, an NMOS transistor MN31, a fuse F, and latch circuits 55 and 57. The NMOS transistor MN31 is turned on or turned off in response to a power-up signal VCCH. If the fuse F is intact, the control signal DRV18 is deasserted after a predetermined time has elapsed. However, if the fuse F is cut, the control signal DRV18 is asserted after a predetermined time has elapsed. The state of the fuse F (i.e., cut or uncut) may be selected based on the level of the third power supply voltage VDDQ. For example, if it is known that the third power supply voltage is 2.5V, the fuse F may be left intact to provide a desired transition rate, and if it is known that the third power supply voltage VDDQ is 1.8V, the fuse F may be cut to provide an appropriate transition rate.

Operation of the transition compensating circuit 30' of FIG. 4 in a case where the third voltage VDDQ is 1.8V will now be described with reference to FIGS. 4 through 6. In this case, the "turn-on" resistance (Ron_mp11) of the pull-up transistor MP11 and the "turn-on" resistance (Ron_mn11) of the pull-down transistor MN11 are increased in response to the reduced third voltage VDDQ, as the control signal DRV18 is asserted. In a case where data DATA is at logic "high", the first logic gate 63 outputs the third control signal UP2 having logic "low", and thus, the auxiliary pull-up transistor MP23 is turned on. Thus, the output terminal OUT" is pulled-up to the level of the third voltage VDDQ by a parallel combination of the pull-up transistor MP11 and the auxiliary pull-up transistor MP23, which can increase the transition rate of the output signal OUT".

In a case where the data DATA is at logic "low", because the pull-down transistor MN11 is turned on and the second logic gate 65 outputs the control signal DOWN' with a logic "high" level, the auxiliary pull-down transistor MN23 is turned on. Thus, the output terminal OUT" is pulled-down to the fourth voltage VSSQ by a parallel combination of the pull-down transistor MN11 and the auxiliary pull-down circuit MN23, and the transition rate of the output signal OUT" can be decreased.

Figure 7A:
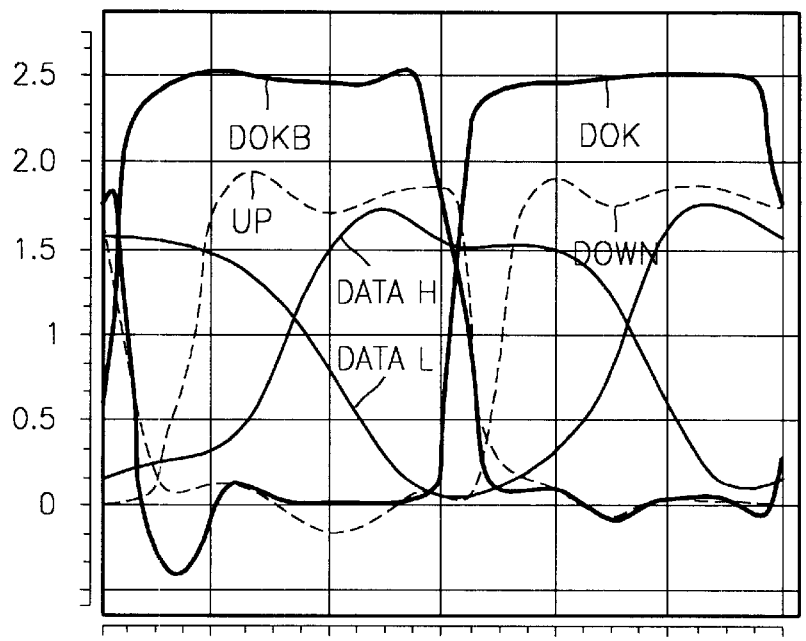
FIG. 7A illustrates output waveforms for a conventional data output buffer.
Figure 7B:
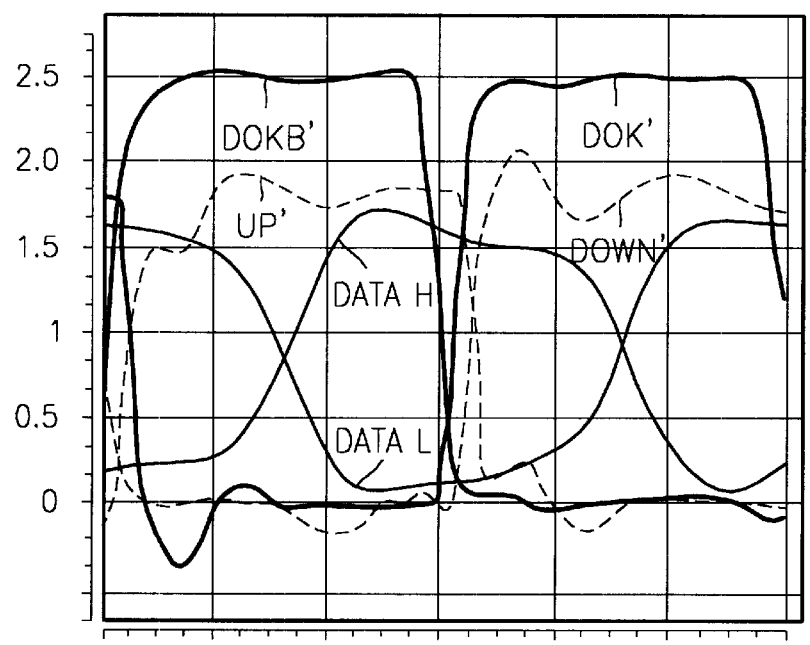
FIG. 7B illustrates some output waveforms of a data output buffer according to some embodiments of the present invention.

FIG. 7A illustrates waveforms of signals for a conventional data output buffer as illustrated in FIG. 1, while FIG. 7B illustrates corresponding signals produced by an data buffer circuit according to embodiments of the present invention illustrated in FIG. 3. Referring to FIGS. 1, 3, 7A and 7B, a transition time of the signal DOKB' of the circuit in FIG. 3 from a logic "high" to a logic "low" is reduced in comparison to the corresponding transition in signal DOKB for the circuit of FIG. 1. Thus, skew in the output signal produced by the circuit in FIG. 3 can be reduced in comparison to the circuit of FIG. 1.

In particular, referring to FIG. 3, assume the "turn-on" resistance of the PMOS transistor MP11 is the same as the "turn-on" resistance of the NMOS transistor MN11, the first voltage VDDP is 2.5V, and the second voltage VSSP and the fourth voltage VSSQ are the ground voltage, and the third voltage VDDQ is 1.8V such that the control signal DRV18 is activated. Thus, the time needed for the output signal DOKB' of the inverter 29 to be pulled-down to a logic "low" is determined by the resistance Req2, defined in equation (2).

As described above, the data output buffer according to the present invention includes an interface between circuits using different voltages, and the interface senses variation in the voltage of the circuit, thereby controlling a transition time (or slope) of the output signal and reducing skew in the output signal.

Further, the supply voltage VDDQ of the output driver circuit 50 is reduced, thereby reducing a swing width of the signal of the output terminal OUT' or OUT", improving signal integrity during a high speed operation, improving interchangeability properties of interface devices, and reducing power consumption.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A data buffer circuit comprising:
   first and second driver circuits operative to respectively pull up and pull down their outputs towards respective first and second voltages responsive to first and second data signals;
   an output circuit comprising first and second transistors connected at an output node and operative to respectively pull up and pull down the output node toward respective third and fourth voltages responsive to respective ones of the outputs of the first and second driver circuits; and
   a transition compensation circuit operative to control relative rates at the output node of the output circuit transitions toward the first and second voltages responsive to a transition rate control signal,
   wherein the transition compensation circuit comprises:
      a driver circuit coupled in series with an input of one of the first and second driver circuits; and
      a bias control circuit coupled to a power supply input of the driver circuit and operative to vary an impedance between the power supply input and a power supply node responsive to the transition rate control signal.

2. A data buffer circuit according to claim 1, wherein the driver circuit comprises an inverter.

3. A data buffer circuit according to claim 1, wherein the bias control circuit comprises:
   a voltage divider network coupled between the power supply input of the driver circuit and the power supply node;
   a transistor coupled between a node of the voltage divider network and the power supply node, the transistor having a control terminal configured to receive the control signal.

4. A data buffer circuit according to claim 1, wherein the transition compensation circuit further comprises a selective impedance reduction circuit operative to selectively provide an impedance in parallel with at least one of the first and second transistors of the output circuit responsive to the control signal.

5. A data buffer circuit according to claim 4, wherein the selective impedance reduction circuit comprises:
   third and fourth transistors connected in parallel with respective ones of the first and second transistors of the output circuit;
   first and second drive circuits that drive respective control terminals of the third and fourth transistors responsive to the control signal and to respective ones of the latched data signals.

6. A data buffer circuit according to claim 2, wherein the transition compensation circuit comprises a selective impedance reduction circuit operative to selectively provide an impedance in parallel with at least one of the first and second transistors of the output circuit responsive to the control signal.

7. A data buffer circuit according to claim 6, wherein the selective impedance reduction circuit comprises:
   third and fourth transistors connected in parallel with respective ones of the first and second transistors of the output circuit;
   first and second drive circuits that drive respective control terminals of the third and fourth transistors responsive to the control signal and to respective ones of the latched data signals.

8. A data buffer circuit according to claim 1, further comprising a transition rate control signal generating circuit operative to generate the transition rate control signal.

9. A data buffer circuit according to claim 8, wherein the transition rate control signal generating circuit is operative to generate the transition rate control signal responsive to a comparison of one of the first and second voltages to a reference voltage.

10. A data buffer output circuit according to claim 8, wherein the transition rate control signal generating circuit comprises a fuse and is operative to generate the transition rate control signal responsive to a state of the fuse.

11. A data buffer circuit according to claim 1, wherein the transition rate control signal is generated responsive to a power up signal.

12. A data buffer circuit according to claim 1, further comprising a latch circuit that latches the first and second data signals.

13. A data output buffer comprising:
   a first output circuit for outputting a first output signal that is pulled up to a first voltage or pulled down to a second voltage in response to a first input signal;
   a second output circuit for outputting a second output signal which is pulled up to a third voltage or pulled down to a fourth voltage in response to the first output signal;
   a pull-down circuit for pulling-down an output terminal to the fourth voltage in response to the second output signal; and
   a voltage sensing circuit for sensing that the third voltage is lower than the first voltage, and outputting a control signal; and
   wherein the first output circuit is controlled by the control signal.

14. The data output buffer as claimed in claim 13, further comprising;
   a third output circuit for outputting a third output signal that is pulled up to the third voltage or pulled down to the fourth voltage in response to a second input signal; and
   a pull-up circuit for pulling-up the output terminal to the third voltage in response to the third output signal.

15. The data output buffer as claimed in claim 14, wherein the voltage sensing circuit equalizes a transition time where the voltage of the output terminal is pulled-up to the third voltage with a transition time where the voltage of the output terminal is pulled-down to the fourth voltage.

16. The data output buffer as claimed in claim 13, wherein the voltage sensing circuit includes a voltage comparing circuit for comparing the third voltage with a predetermined reference voltage and outputting the control signal.

17. The data output buffer as claimed in claim 16, wherein the voltage comparing circuit comprises:
   a comparing circuit for comparing the third voltage with the predetermined reference voltage; and
   a logic circuit for outputting the control signal in response to an output signal or a power-up signal of the comparing circuit.

18. The data output buffer as claimed in claim 13, wherein the control signal is generated in a mode register set.

19. The data output buffer as claimed in claim 17, wherein the control signal is the output signal of the comparing circuit in which the third voltage is compared with the predetermined reference voltage and the compared result is output.

20. The data output buffer as claimed in claim 19, wherein the predetermined reference voltage is generated by voltage divide of the first voltage and the second voltage.

21. The data output buffer as claimed in claim 17, wherein the first output circuit comprises:
   a logic circuit for receiving the first input signal;
   a switching circuit connected between a first terminal of the logic circuit and the second voltage, for operating in response to the control signal; and
   a resistor connected between the first terminal and the second voltage.

22. The data output buffer as claimed in claim 13, wherein the control signal is generated by cutting a fuse in a predetermined logic circuit.

23. A data output buffer comprising:
   a first output circuit for outputting a first output signal having the level of a first voltage or second voltage in response to a first input signal;
   a second output circuit for outputting a second output signal having the level of a third voltage or fourth voltage in response to the first output signal;
   a first pull-down circuit for pulling-down an output terminal to the fourth voltage in response to the second output signal;
   a voltage sensing circuit for sensing that the third voltage is lower than the first voltage, and outputting a control signal; and
   a second pull-down circuit for pulling-down the output terminal to the fourth voltage in response to the control signal or the first output signal.

24. The data output buffer as claimed in claim 23, further comprising;
   a third output circuit for outputting a third output signal having the level of the third voltage or the fourth voltage in response to a second input signal;
   a first pull-up circuit for pulling-up the output terminal to the third voltage in response to the third output signal; and
   a second pull-up circuit for pulling-up the output terminal to the third voltage in response to the control signal or the second input signal.

25. The data output buffer as claimed in claim 24, wherein the voltage sensing circuit equalizes a transition time where the voltage of the output terminal is pulled up to the third voltage with a transition time where the voltage of the output terminal is pulled down to the fourth voltage.

26. The data output buffer as claimed in claim 24, wherein the second pull-down circuit reduces time where the output terminal is pulled down to the fourth voltage, and the second pull-up circuit reduces time where the output terminal is pulled up to the third voltage.

27. The data output buffer as claimed in claim 23, wherein the first output circuit comprises:
   a logic circuit for receiving the first input signal;
   a switching circuit connected between a first terminal of the logic circuit and the second voltage, for operating in response to the control signal; and a resistor connected between the first terminal and the second voltage.

28. The data output buffer as claimed in claim 27, wherein the "turn-on" resistance of the switching circuit is lower than resistance of the resistor.

29. The data output buffer as claimed in claim 23, wherein the control signal is generated in a mode register set.

30. The data output buffer as claimed in claim 23, wherein the control signal is the output signal of the comparing circuit in which the third voltage is compared with a predetermined reference voltage and the compared result is output.

31. The data output buffer as claimed in claim 30, wherein the predetermined reference voltage is generated by voltage divide of the first voltage and the second voltage.

32. The data output buffer as claimed in claim 30, wherein the voltage sensing circuit further includes a logic circuit for responding to an output signal or a power-up signal of the comparing circuit.

33. The data output buffer as claimed in claim 23, wherein the control signal is generated by cutting a fuse in a predetermined logic circuit.

34. A data output buffer comprising:
   a first logic circuit for outputting a first output signal having the level of a first voltage or second voltage in response to an input signal;
   a second logic circuit for outputting a second output signal having the level of a third voltage or fourth voltage in response to the first output signal;
   a driving circuit for driving the voltage of an output terminal to the level of the third voltage or at the level of the fourth voltage in response to the second output signal; and
   a voltage sensing circuit for outputting a control signal such that time where the voltage of the output terminal is pulled up to the third voltage is equalized with time where the voltage of the output terminal is pulled down at the fourth voltage.

35. The data output buffer as claimed in claim 34, wherein the voltage sensing circuit comprises:
   a comparing circuit for comparing the third voltage with predetermined reference voltage; and a logic circuit for responding to an output signal or a power-up signal of the comparing circuit.

36. The data ouput buffer as claimed in claim 34, wherein the first logic circuit comprises:

one or more latch circuits for latching the input signal;

a logic circuit for driving an output signal of the latch circuit;

a switching circuit connected between a first terminal of the logic circuit and the second voltage, for operating in response to the control signal; and a resistor connected between the first terminal and the second voltage.

37. The data output buffer as claimed in claim 36, wherein the "turn-on" resistance of the switching circuit is lower than resistance of the resistor.

38. The data output buffer as claimed in claim 36, wherein the second logic circuit comprises:

a first transistor for receiving the input signal; and a second transistor for receiving the output signal of the logic circuit; and wherein the output signal of the first transistor pulls-up the voltage of the output terminal of the driving circuit to the second voltage by driving the driving circuit, and the output signal of the second transistor pulls-down the voltage of the output terminal of the driving circuit to the fourth voltage by driving the driving circuit.

39. The data output buffer as claimed in claim 34, further comprising:

an auxiliary pull-up circuit for pulling-up the output terminal to the third voltage in response to the control signal or the first output signal; and an auxiliary pull-down circuit for pulling-down the output terminal to the fourth voltage in response to the control signal or the first output signal.

\* \* \* \* \*

UNITED STATES PATENT AND TRADEMARK OFFICE
CERTIFICATE OF CORRECTION

PATENT NO.   : 6,696,860 B2
DATED        : February 24, 2004
INVENTOR(S)  : Jong-hyoung Lim et al.

It is certified that error appears in the above-identified patent and that said Letters Patent is hereby corrected as shown below:

Column 8,
Line 18, change "claim 2" to -- claim 1 --.

Column 10,
Line 23, at "a resistor" begin a new paragraph.

Signed and Sealed this

Eighteenth Day of May, 2004

JON W. DUDAS
*Acting Director of the United States Patent and Trademark Office*